US009343261B2

(12) United States Patent
Chang et al.

(10) Patent No.: US 9,343,261 B2
(45) Date of Patent: May 17, 2016

(54) DESKTOP ELECTRON MICROSCOPE AND COMBINED ROUND-MULTIPOLE MAGNETIC LENS THEREOF

(71) Applicant: NATIONAL TSING HUA UNIVERSITY, Hsinchu (TW)

(72) Inventors: Wei-Yu Chang, Hsinchu (TW); Fu-Rong Chen, Hsinchu (TW); Te-Hui Lee, Hsinchu (TW); Tsu-Wei Huang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/534,815

(22) Filed: Nov. 6, 2014

(65) Prior Publication Data

US 2016/0042911 A1 Feb. 11, 2016

(30) Foreign Application Priority Data

Aug. 8, 2014 (TW) .............................. 103127317 A

(51) Int. Cl.
*H01J 37/153* (2006.01)
*H01J 37/141* (2006.01)
*H01J 37/26* (2006.01)
*H01J 37/14* (2006.01)
*H01J 37/145* (2006.01)

(52) U.S. Cl.
CPC .............. *H01J 37/153* (2013.01); *H01J 37/14* (2013.01); *H01J 37/141* (2013.01); *H01J 37/145* (2013.01); *H01J 37/1413* (2013.01); *H01J 37/26* (2013.01); *H01J 2237/141* (2013.01)

(58) Field of Classification Search
None
See application file for complete search history.

(56) References Cited

U.S. PATENT DOCUMENTS

| 2,503,173 | A | * | 4/1950 | Reisner | .................. | H01J 37/14 |
| | | | | | | 250/396 ML |
| 3,818,394 | A | * | 6/1974 | Katagiri | .................. | H01F 6/00 |
| | | | | | | 250/396 ML |
| 3,984,687 | A | * | 10/1976 | Loeffler | .................. | H01J 37/09 |
| | | | | | | 250/396 ML |
| 4,629,899 | A | * | 12/1986 | Plies | ....................... | G21K 1/08 |
| | | | | | | 250/251 |
| 4,633,208 | A | * | 12/1986 | Voss | ....................... | G21K 1/08 |
| | | | | | | 335/209 |

(Continued)

FOREIGN PATENT DOCUMENTS

| CN | 100405110 C | 7/2008 |
| TW | 541567 | 7/2003 |
| TW | 201201241 A1 | 1/2012 |

*Primary Examiner* — Michael Logie
(74) *Attorney, Agent, or Firm* — Li & Cai Intellectual Property (USA) Office

(57) ABSTRACT

A combined round-multipole magnetic lens comprises a coil bracket, a first pole piece and a second pole piece. At least a first pole shoe of the first pole piece on the coil support and at least a second pole shoe of the second pole piece under the coil support respectively extend towards the central axis. The first pole shoe and the second pole shoe are symmetric according to the central axis, or the first pole shoes and the second pole shoes are respectively symmetrically arranged, and the angle difference between the first pole shoe and the adjacent second pole shoes is 360/2N degrees. A magnetic circuit gap is formed between the first pole shoe and the adjacent second pole shoe, for generating a magnetic field distribution of multi-poles and reducing the volume and the number of power supplies.

3 Claims, 9 Drawing Sheets

(56) References Cited

U.S. PATENT DOCUMENTS

| | | | | |
|---|---|---|---|---|
| 4,962,313 A | * | 10/1990 | Rose | H01J 37/153 250/310 |
| 5,838,011 A | * | 11/1998 | Krijn | H01J 37/153 250/396 R |
| 6,057,553 A | * | 5/2000 | Khursheed | H01J 37/14 250/442.11 |
| 6,184,525 B1 | * | 2/2001 | Van Der Mast | H01J 37/244 250/310 |
| 6,414,319 B1 | | 7/2002 | Spehr | |
| 7,652,957 B2 | | 1/2010 | Tsutsumi | |
| 2002/0104966 A1 | * | 8/2002 | Plies | H01J 49/288 250/311 |
| 2005/0029466 A1 | * | 2/2005 | Kawai | H01J 9/18 250/396 R |
| 2007/0181806 A1 | * | 8/2007 | Nakano | H01J 37/153 250/310 |
| 2009/0039281 A1 | * | 2/2009 | Kawasaki | G01N 23/20 250/396 R |
| 2013/0320227 A1 | * | 12/2013 | Urano | H01J 37/153 250/396 R |
| 2015/0287566 A1 | * | 10/2015 | Kohno | H01J 37/141 250/396 ML |

* cited by examiner

DESKTOP ELECTRON MICROSCOPE AND COMBINED ROUND-MULTIPOLE MAGNETIC LENS THEREOF

BACKGROUND OF THE INVENTION

1. Field of the Invention

The instant disclosure relates to a magnetic lens; in particular, to a desktop electron microscope and a combined round-multipole magnetic lens thereof.

2. Description of Related Art

Please refer to FIG. 1 showing a schematic diagram of a conventional electron microscope. The electron microscope comprises an electron gun 11 and a plurality of lens 12, 13, 141, 15. The mentioned lens may be magnetic lens or electric lens. The lens 12, 13 may be focus lenses, the lens 141 may be an aberration correction lens (which is cooperated with the electron deflector 14), and the lens 15 is an objective lens. After passing the lens 15 and the detector 16, the electron beam 4 hits the target 3. The type of the electron microscope can be the scanning electron microscope (SEM) or the transmission electron microscope (TEM). Whatever the type of the electron microscope is, the design of the lens greatly affects the performance of the electron microscope.

In recent years, the requirements for image resolution become important due to the development of electron microscopy. After the invention of the aberration corrector, it has become possible to enhance the image resolution of the electron microscope to sub-angstrom. Non-rotational symmetric multipole lens are often used in the aberration correctors in electron optical system.

The conventional aberration corrector is usually constituted by a plurality of multipole magnetic lens or electric lens. The aberration correction of the electron microscope is usually obtained by using a series of multipole lenses, and each lens has its respective function, wherein the function of the dipole lens is deflecting the electron beam by acting as a deflector, the quadrupole lens is usually for correction of chromatic aberration by using four magnetic lens cooperated with a quadrupole electric lens, and the octupole lens can be used to correct spherical aberration. However, the utilized quadrupole lens and the octupole lens can introduce more aberrations, and the hexapole lens is needed for compensation. Referring to FIG. 2, for example, the conventional aberration correction lens group may comprise two hexapole lenses 101, 102 and two cylindrical lenses 103, 104, wherein f is the focal length. Therefore, in order to use the multipole lens, it usually needs to cooperate with a plurality of power supplies for providing multiple magnetic fields or electric fields. However, after the invention of the desktop electron microscope, a lens (or lenses) with smaller volume is needed for achieving the aberration correction function or other related functions.

SUMMARY OF THE INVENTION

The object of the instant disclosure is to provide a combined round-multipole magnetic lens which is a tunable magnetic lens with both the functions of multipole and focus simultaneously. The characteristics of the this technology is to properly arrange the distance between the iron shells (pole pieces) and the distances between the pole shoes, in order to produce any needed multipole magnetic field distribution, and the number of the required power supply can be reduced.

In order to achieve the aforementioned objects, according to an embodiment of the instant disclosure, a combined round-multipole magnetic lens is provided. The combined round-multipole magnetic lens comprises a coil support, a first pole piece and a second pole piece. The coil support is for winding a coil according to a central axis. The center of the coil support has a central opening portion for the electron beam passing through the central opening portion. The first pole piece is adjacently disposed at an upper-side of the coil support, and has a first opening portion corresponding to the central opening portion of the coil support and a first pole shoe. The first pole shoe extends from an inner edge of the first opening portion to the central axis. The second pole piece is adjacently disposed at an under-side of the coil support, and has a second opening portion corresponding to the central opening portion of the coil support and a second pole shoe. The second pole shoe extends from an inner edge of the second opening portion to the central axis. The first pole shoe and the second pole shoe are symmetric according to the central axis. The first pole shoe and the second pole shoe form a magnetic-circuit gap. When the coil is fed with an electric current, the first pole shoe, the magnetic-circuit gap and the second pole shoe form a first magnetic circuit.

In order to achieve the aforementioned objects, according to an embodiment of the instant disclosure, a combined round-multipole magnetic lens is provided. The combined round-multipole magnetic lens comprises a coil support, a first pole piece and a second pole piece. The coil support is for winding a coil according to a central axis. The center of the coil support has a central opening portion for the electron beam passing through the central opening portion. The first pole piece is adjacently disposed at an upper-side of the coil support, and has a first opening portion corresponding to the central opening portion of the coil support and a plurality of first pole shoes. The first pole shoes extend from an inner edge of the first opening portion to the central axis. The second pole piece is adjacently disposed at an under-side of the coil support, and has a second opening portion corresponding to the central opening portion of the coil support and a plurality of second pole shoes. The second pole shoes extend from an inner edge of the second opening portion to the central axis. The number of the first pole shoes and the number of the second pole shoes are N respectively, N is an integer larger than one. The plurality of first pole shoes are symmetrically arranged according to the central axis. The plurality of second pole shoes are symmetrically arranged according to the central axis. Each first pole shoe and the adjacent second pole shoe differ from each other at an angle according to the central axis, the angle is 360/2N degrees. Each first pole shoe and the adjacent second pole shoe form a magnetic-circuit gap. When the coil is fed with an electric current, the first pole shoe, the corresponding magnetic-circuit gap and the second pole shoe form a first magnetic circuit.

In order to achieve the aforementioned objects, according to an embodiment of the instant disclosure, a desktop electron microscope is provided. The desktop electron microscope comprises an electron gun and at least a combined round-multipole magnetic lens. The electron gun is for providing an electron beam. The combined round-multipole magnetic lens comprises a coil support, a first pole piece and a second pole piece. The coil support is for winding a coil according to a central axis. The center of the coil support has a central opening portion for the electron beam passing through the central opening portion. The first pole piece is adjacently disposed at an upper-side of the coil support, and has a first opening portion corresponding to the central opening portion of the coil support and a plurality of first pole shoes. The first pole shoes extend from an inner edge of the first opening portion to the central axis. The second pole piece is adjacently disposed at an under-side of the coil support, and has a second opening portion corresponding to the central opening portion of the coil support and a plurality of second pole shoes. The second pole shoes extend from an inner edge of the second opening portion to the central axis. The number of the first pole shoes and the number of the second pole shoes are N respectively, N is an integer larger than one. The plurality of first pole shoes are symmetrically arranged according to the central axis. The plurality of second pole shoes are symmetrically arranged according to the central axis. Each first pole shoe and the adjacent second pole shoe differ from each other at an angle according to the central axis, the angle is 360/2N degrees. Each first pole shoe and the adjacent second pole shoe form a magnetic-circuit gap. When the coil is fed with an electric current, the first pole shoe, the corresponding magnetic-circuit gap and the second pole shoe form a first magnetic circuit.

In summary, a desktop electron microscope is provided, and the geometrical arrangement and design of the magnetic lens are utilized to obtain both the ability of a magnetic focusing lens and multipole lens. Also, the ratio of the functions of the magnetic focusing lens and the multipole lens can be determined by the relative size of the magnetic-circuit gap, meanwhile only one power supply is needed, such that the occupied volume can be greatly reduced.

In order to further the understanding regarding the instant disclosure, the following embodiments are provided along with illustrations to facilitate the disclosure of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

The greatest difficulty of designing the desktop electron microscope is that the volume must be kept small. The conventional aberration corrector usually needs a plurality of power supplies due to the utilized multipole lens, such that the volume would be increased accordingly. The instant disclosure provides a novel design which reduces the required power supplies while retaining the ability of multipole aberration correction, in order to reduce the total volume of the lens.

[An Embodiment of a Desktop Electron Microscope and a Combined Round-Multipole Magnetic Lens Thereof]

Figure 1:
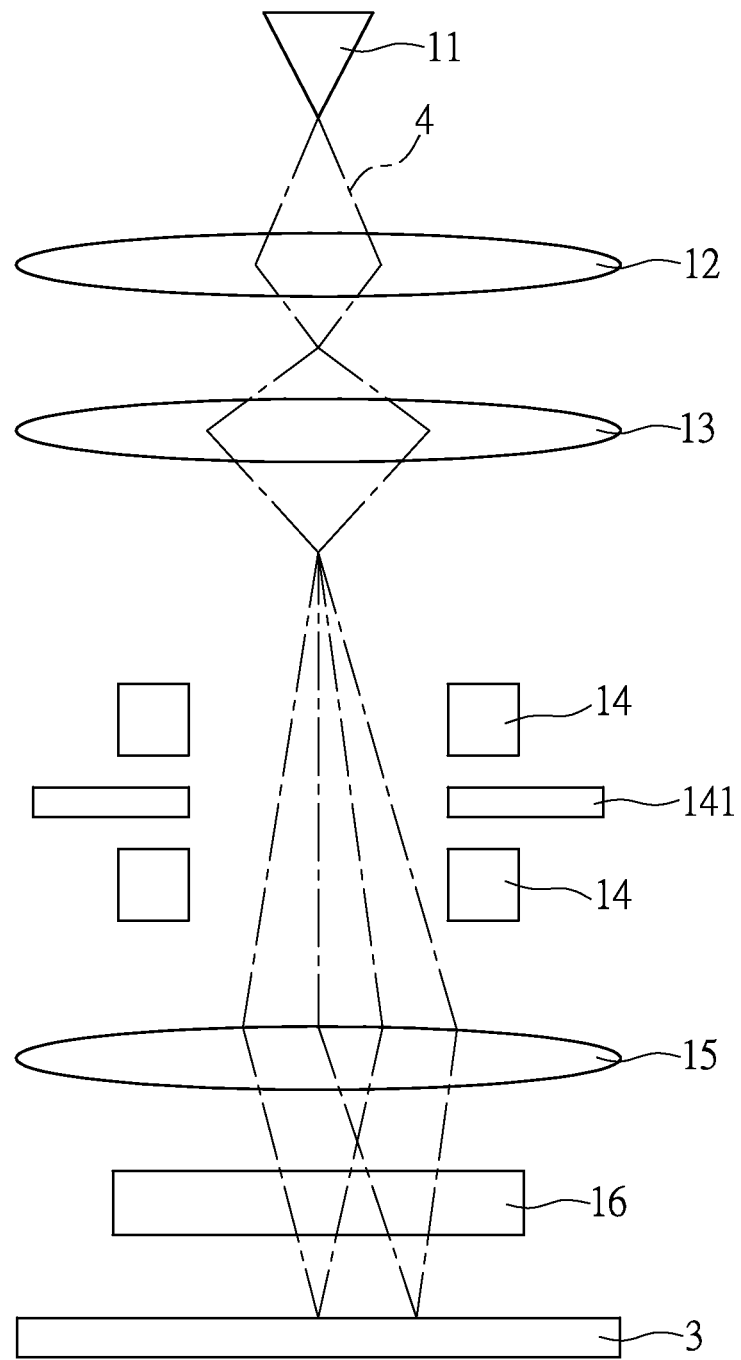
FIG. 1 shows a schematic diagram of a conventional electron microscope.
Figure 2:
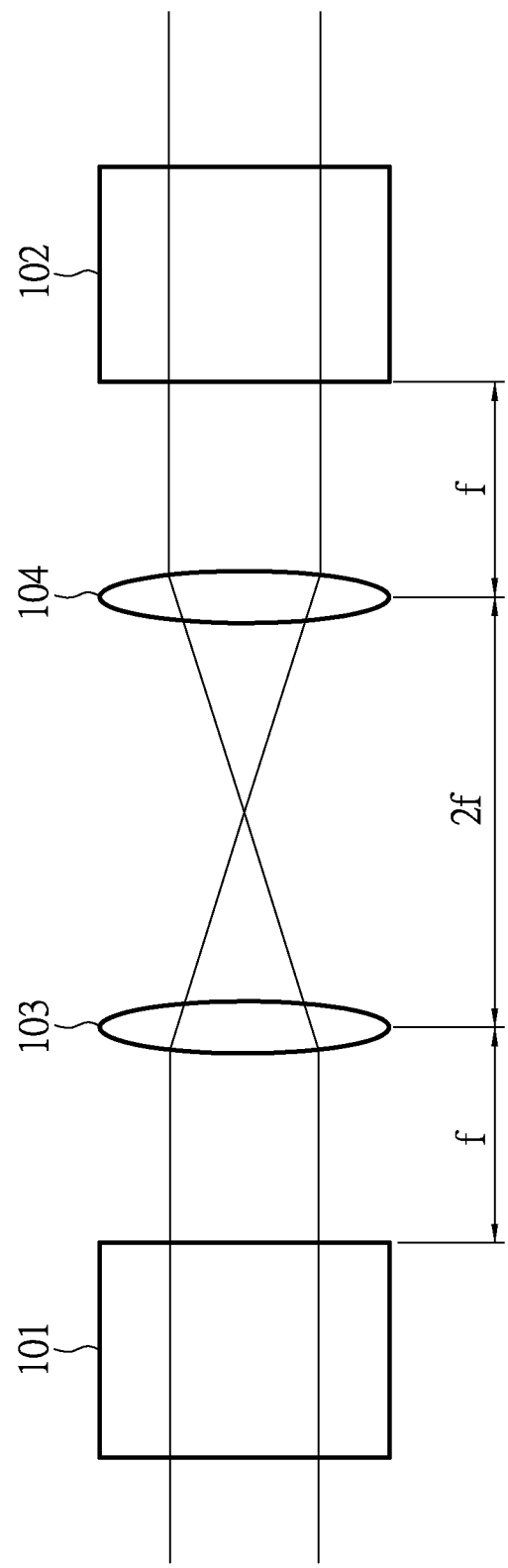
FIG. 2 shows a schematic diagram of a conventional aberration correction lens set.

This embodiment provides a desktop electron microscope and a combined round-multipole magnetic lens thereof. The desktop electron microscope of this embodiment comprises an electron gun 11 as shown in FIG. 1 and at least a combined round-multipole magnetic lens. The instant disclosure does not restrict the application type for the combined round-multipole magnetic lens. For example, the combined round-multipole magnetic lens may be a focus lens, an objective lens, an aberration correction lens, a diffraction lens, a projection lens, an intermediate lens . . . , and so on.

Figure 3A:
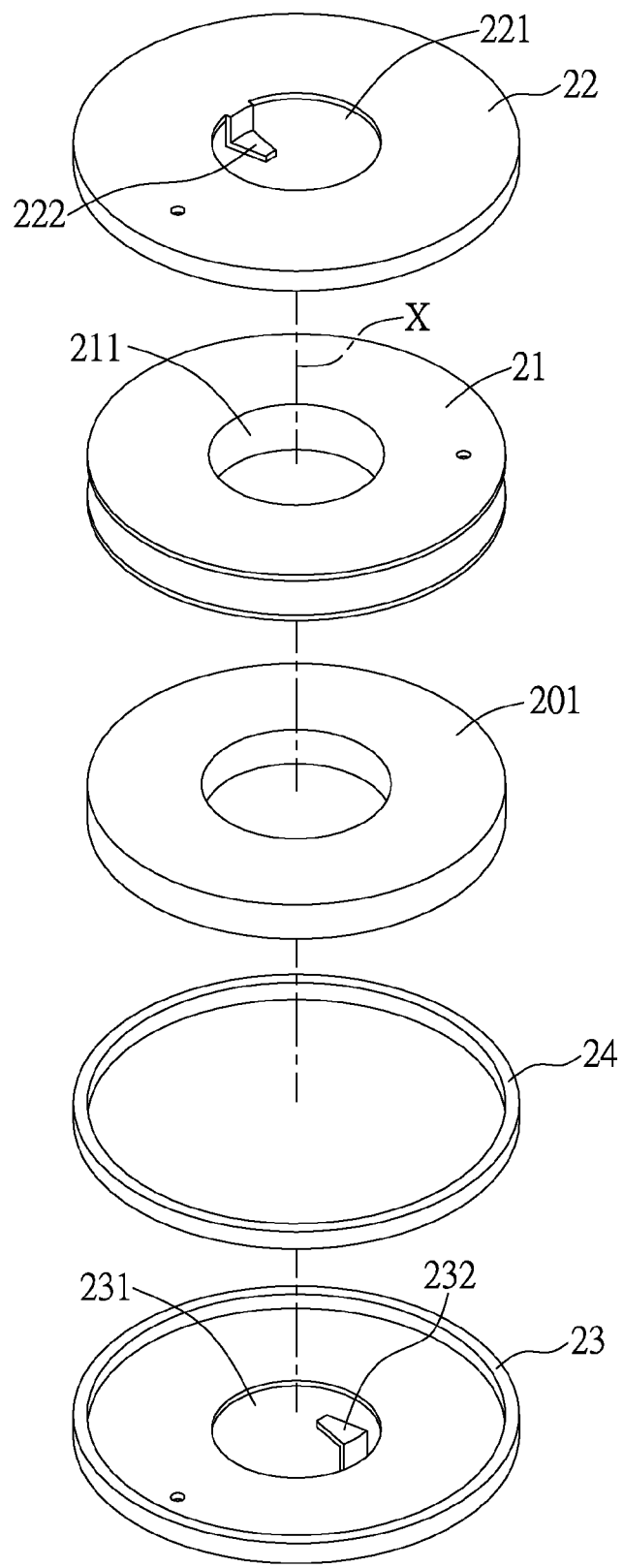
FIG. 3A shows an exploded view drawing of a combined round-multipole magnetic lens according to an embodiment of the instant disclosure.
Figure 3B:
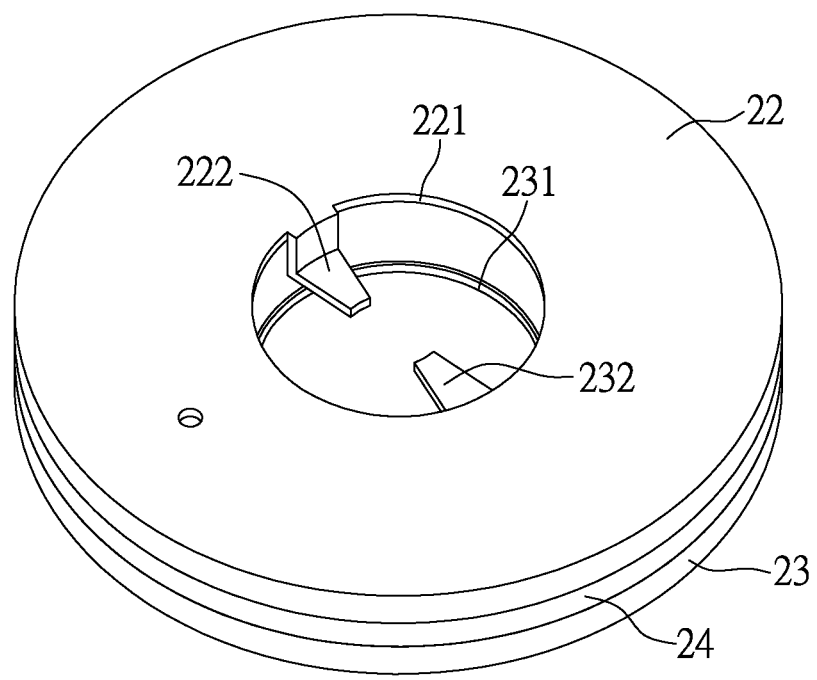
FIG. 3B shows an appearance drawing of a combined round-multipole magnetic lens according to an embodiment of the instant disclosure.
Figure 3C:
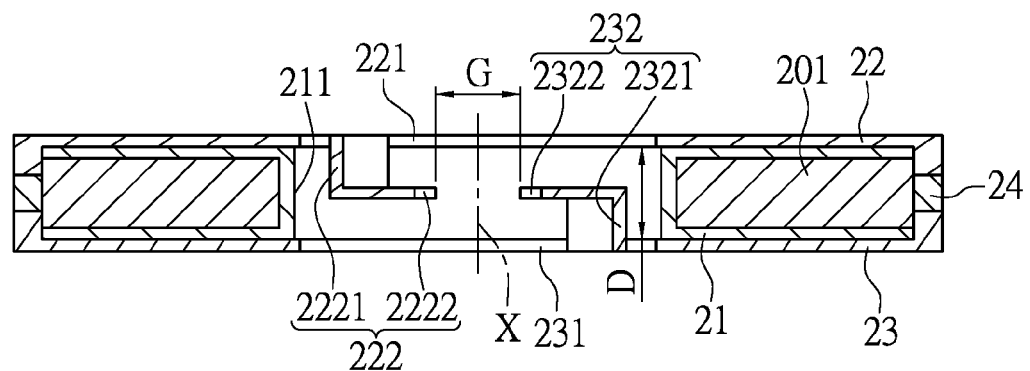
FIG. 3C shows cross-sectional view of a combined round-multipole magnetic lens according to an embodiment of the instant disclosure.

Please refer to FIG. 3A in conjunction with FIG. 3B and FIG. 3C, FIG. 3A shows an exploded view drawing of a combined round-multipole magnetic lens according to an embodiment of the instant disclosure, FIG. 3B shows an appearance drawing of a combined round-multipole magnetic lens according to an embodiment of the instant disclosure, FIG. 3C shows cross-sectional view of a combined round-multipole magnetic lens according to an embodiment of the instant disclosure. The combined round-multipole magnetic lens comprises a coil support 21, a first pole piece 22 and a second pole piece 23. The coil support 21 is for winding a coil 201 according to a central axis X. The center of the coil support 21 has a central opening portion 211 for the electron beam passing through the central opening portion 211 (for example, the electron beam may transmit substantially along the central axis X). The first pole piece 22 is adjacently disposed at an upper-side of the coil support 21, and has a first opening portion 221 corresponding to the central opening portion 211 of the coil support 21 and a first pole shoe 222. The first pole shoe 222 extends from an inner edge of the first opening portion 221 to the central axis X. The second pole piece 23 is adjacently disposed at an under-side of the coil support 21, and has a second opening portion 231 corresponding to the central opening portion 211 of the coil support 21 and a second pole shoe 232. The second pole shoe 232 extends from an inner edge of the second opening portion 231 to the central axis X. The first pole shoe 222 and the second pole shoe 232 are symmetrical according to the central axis X. The first pole shoe 222 and the second pole shoe 232 form a magnetic-circuit gap G. It is worth mentioning that, regarding the design of the magnetic-circuit gap G, in comparing the magnetic-circuit gap G with the distance D between the first opening portion 221 and the second opening portion 231 of the design, the multipole effect would be more obvious when the former is smaller than the latter, and the focusing effect would be more obvious when the former is larger than the latter, however, the instant disclosure is not so restricted. In this embodiment, the magnetic-circuit gap G smaller than the distance D between the first opening portion 221 and the second opening portion 231 is taken as an example for explanation.

Please refer to FIG. 3C, the structures of the first pole shoe 222 and the second pole shoe 232 of this embodiment are further described thereafter, but this should not be a limitation to the instant disclosure. The first pole shoe 222 has a first extending portion 2221 and a first ending portion 2222. The first ending portion 2222 is connected with the inner edge of the first opening portion 221 of the first pole piece 22 through the first extending portion 2221. The second pole shoe 232 has a second extending portion 2321 and a second ending portion 2322. The second ending portion 2322 is connected with the inner edge of the second opening portion 231 of the second pole piece 23 through the second extending portion 2321, wherein the first ending portion 2222 and the second ending portion 2322 are located in the same horizontal plane, and the mentioned horizontal plane is perpendicular to the central axis X.

Please refer to FIG. 3A in conjunction with FIG. 3C, the mentioned combined round-multipole magnetic lens may further comprise a permanent magnet 24. The permanent magnet 24 forms an annular structure according to the central axis X. The permanent magnet 24 is disposed at the outer side of the coil 201 away from the central axis X, and located between the first pole piece 22 and the second pole piece 23. The permanent magnet 24 of this embodiment could provide a constant permanent magnetic field. However, the permanent magnet 24 could be removed according to actual design requirement.

Figure 3D:
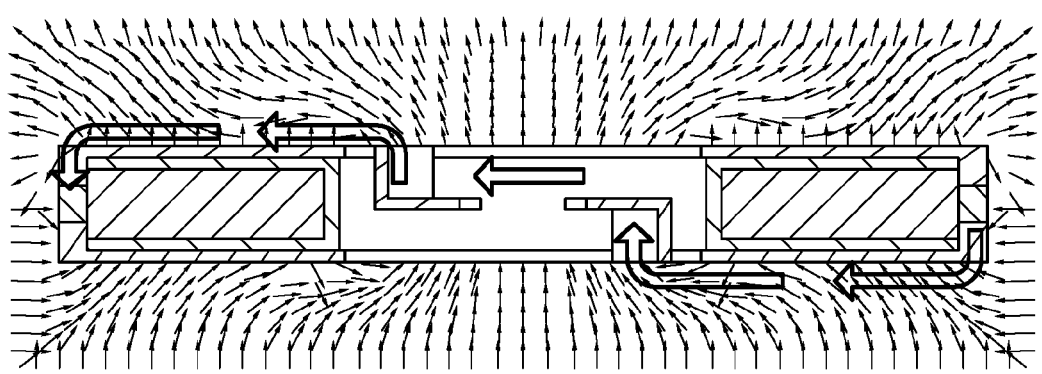
FIG. 3D shows the magnetic field plot and the magnetic circuit plot of a combined round-multipole magnetic lens when the coil is fed with an electric current according to an embodiment of the instant disclosure.

Please refer to FIG. 3C in conjunction with FIG. 3D, FIG. 3D shows the magnetic field plot and the magnetic circuit plot of a combined round-multipole magnetic lens when the coil is fed with an electric current according to an embodiment of the instant disclosure. When the coil 201 is fed with an electric current, the first pole shoe 222, the magnetic-circuit gap G and the second pole shoe 232 form a first magnetic circuit. In other words, according to the design of FIG. 3C, when designing the distance (which is the magnetic-circuit gap G) between the first pole shoe 222 and the second pole shoe 232 to be smaller than the shortest distance between the first pole piece 22 and the second pole piece 23, the magnetic field lines would select the shortest path ideally, thus a dipole magnetic field would occur. On the other hand, in practical applications, the first opening portion 221 of the first pole piece 22 and the second opening portion 231 of the second pole piece 23 form a second magnetic circuit when the coil is fed with the electric current, wherein the magnetic flux in the first magnetic circuit is larger than the magnetic flux in the second magnetic circuit. That is, because the distance between the first pole shoe 222 and the second pole shoe 232 is shorter actually, a majority of the magnetic flux would pass the first pole shoe 222 and the second pole shoe 232, and only a small amount of magnetic flux would pass the inner edges of the first opening portion 221 and the second opening portion 231. However, the relative gaps of the first magnetic circuit and the second magnetic circuit could be adjusted regarding the requirement of the multipole lens and the focus lens in designs of practical applications, thus the portions of magnetic flux in the two magnetic circuits can be controlled accordingly.

Additionally, the multipole magnetic lens, whether quadrupole, hexapole, octupole or even twelve-pole, designed by this method only needs to change the numbers of the first pole shoe 222 and the second pole shoe 232 without adding any additional power supply. Besides, the magnetic field designed by this method both has the function of multipole lens and cylindrical lens.

[Another Embodiment of a Desktop Electron Microscope and a Combined Round-Multipole Magnetic Lens Thereof]

This embodiment provides another desktop electron microscope and a combined round-multipole magnetic lens thereof. The desktop electron microscope comprises an electron gun 11 as shown in FIG. 1 and at least a combined round-multipole magnetic lens which will be described thereafter.

Figure 4A:
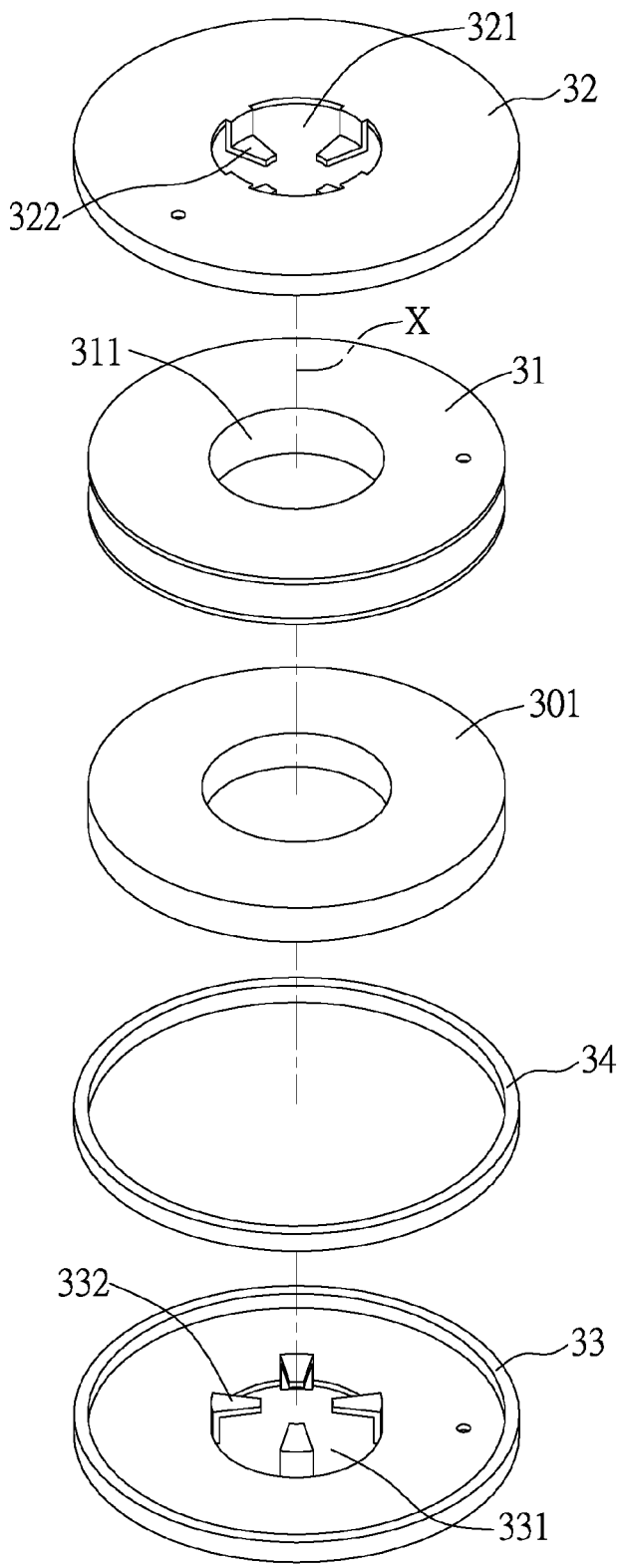
FIG. 4A shows an exploded view drawing of a combined round-multipole magnetic lens according to another embodiment of the instant disclosure.
Figure 4B:
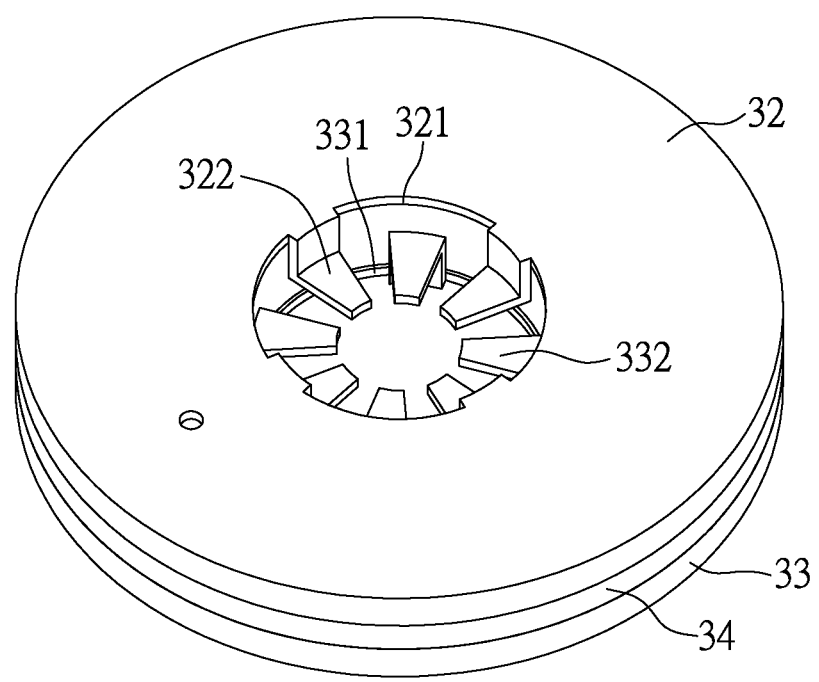
FIG. 4B shows an appearance drawing of a combined round-multipole magnetic lens according to another embodiment of the instant disclosure.

Please refer to FIG. 4A in conjunction with FIG. 4B, FIG. 4A shows an exploded view drawing of a combined round-multipole magnetic lens according to another embodiment of the instant disclosure, FIG. 4B shows an appearance drawing of a combined round-multipole magnetic lens according to another embodiment of the instant disclosure. When applying the design of the previous embodiment to the multipole lens, the number of the first pole shoes and the number of the second pole shoes are N respectively, and detailed structure is described in the following. Taking the octupole lens shown in FIG. 4A and FIG. 4B as an example, the number of the first pole shoes and the number of the second pole shoes are four respectively.

The combined round-multipole magnetic lens comprises a coil support 31, a first pole piece 32 and a second pole piece 33. The coil support 31 is for winding a coil 301 according to a central axis X. The center of the coil support 31 has a central opening portion 311 for the electron beam passing through the central opening portion 311. The first pole piece 32 is adjacently disposed at an upper-side of the coil support 31, and has a first opening portion 321 corresponding to the central opening portion 311 of the coil support 31 and a plurality of first pole shoes 322. The first pole shoes 322 extend from an inner edge of the first opening portion 321 to the central axis X. The second pole piece 33 is adjacently disposed at an under-side of the coil support 31, and has a second opening portion 331 corresponding to the central opening portion 311 of the coil support 31 and a plurality of second pole shoes 332. The second pole shoes 332 extend from an inner edge of the second opening portion 3331 to the central axis X. The number of the first pole shoes 321 and the number of the second pole shoes 331 are N respectively, N is an integer larger than one. Taking FIG. 4A and FIG. 4B as an example, the number of the first pole shoes 322 and the number of the second pole shoes 332 are both four. The plurality of first pole shoes 322 are symmetrically arranged according to the central axis X. The plurality of second pole shoes 332 are symmetrical arranged according to the central axis X. Each first pole shoe 322 and the adjacent second pole shoe 332 differ from each other at an angle according to the central axis X, wherein the angle is 360/2N degrees. That is, the first pole shoes 322 symmetrically arranged according to the central axis X and the second pole shoes 332 symmetrically arranged according to the central axis X are set interlaced with each other, and the angle of the first pole shoe 322 and the angle of the adjacent second pole shoe 332 are differing 360/2N degrees in respect to the central axis X, wherein 2N is the total number of the pole shoes (comprising N of the first pole shoes 322 and N of the second pole shoes 332).

Each first pole shoe 322 and the adjacent second pole shoe 332 form a magnetic-circuit gap. In this embodiment, the magnetic-circuit gap is smaller than the distance between the first opening portion 321 and the second opening portion 331. That is, the distance between the adjacent first pole shoe 322 and the second pole shoe 332 is smaller than the shortest distance between the first pole piece 32 and the second pole piece 33, as shown in FIG. 4A and FIG. 4B, but the instant disclosure is not restricted thereto. The magnetic-circuit gap is formed by the first pole shoe 322 and the adjacent second pole shoe 332, the distance between the first opening portion 321 and the second opening portion 331 may be adjusted as needed according the requirement for multipole lens and the focus lens. When the coil 301 is fed with an electric current, the first pole shoe 322, the corresponding magnetic-circuit gap and the second pole shoe 332 form a first magnetic circuit.

Please refer to FIG. 4A again, the mentioned combined round-multipole magnetic lens may further comprise a permanent magnet 34. The permanent magnet 34 forms an annular structure according to the central axis X. The permanent magnet 34 is disposed at the outer side of the coil 301 away from the central axis X, and is located between the first pole piece 32 and the second pole piece 33. The permanent magnet 34 of this embodiment could provide a constant permanent magnetic field. However, the permanent magnet 34 can be removed according actual design requirement.

Furthermore, the structures of the first pole shoe 322 and the second pole 332 are similar to that of the first pole shoe 222 and the second pole 232 in the previous embodiment. The first pole shoe 322 has a first extending portion and a first ending portion. The first ending portion is connected with the inner edge of the first opening portion 321 of the first pole piece 32 through the first extending portion. The second pole shoe 332 has a second extending portion and a second ending portion. The second ending portion is connected with the inner edge of the second opening portion 331 of the second pole piece 33 through the second extending portion, wherein the first ending portion and the second ending portion are located in the same horizontal plane, and the mentioned horizontal plane is perpendicular to the central axis X. In practical applications, the first opening portion 321 of the first pole piece 32 and the second opening portion 331 of the second pole piece 33 form a second magnetic circuit when the coil is fed with electric current, wherein the magnetic flux in the first magnetic circuit is larger than the magnetic flux in the second magnetic circuit.

Figure 5A:
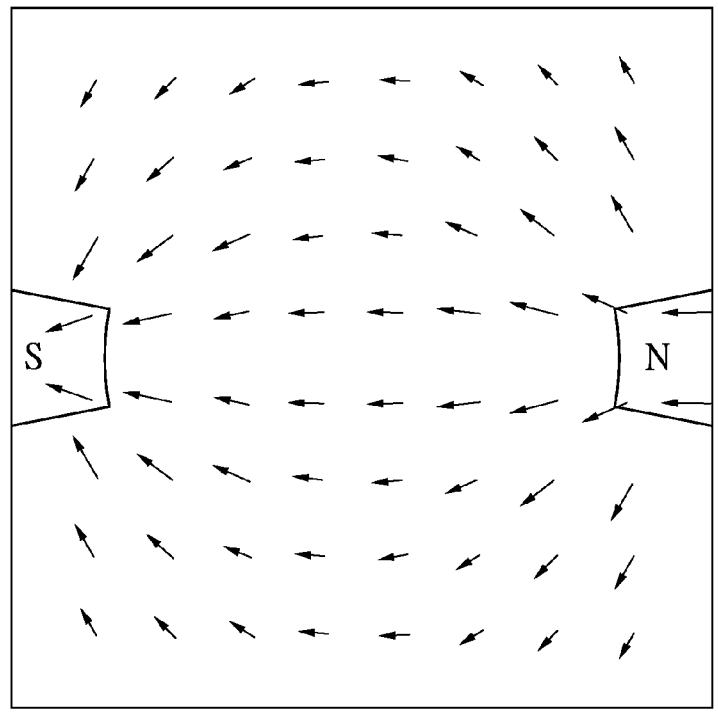
FIG. 5A shows a top view of the combined round-multipole magnetic lens shown in FIG. 3A.

Here the magnetic field distribution of the mentioned multipole magnetic lens is exemplarily described. Please refer to FIG. 5A showing a top view of the combined round-multipole magnetic lens shown in FIG. 3A, in which it shows the magnetic field distribution of a dipole lens. The first pole shoe 322 and the second pole shoe 332 respectively are the pole N and the pole S (or the pole S and the pole N). The first pole shoe 322, the corresponding magnetic-circuit gap and the second pole shoe 332 form a first magnetic circuit.

Figure 5B:
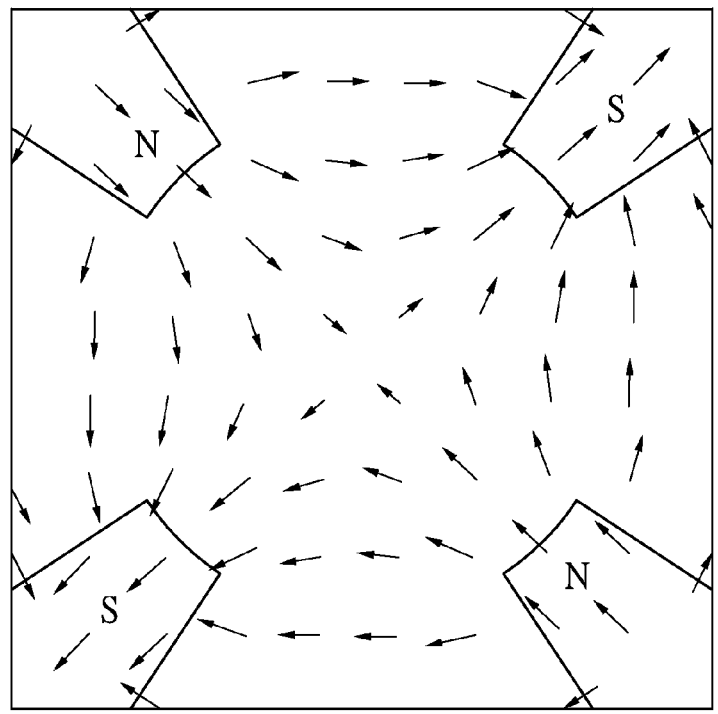
FIG. 5B shows a top view of a round quadrupole magnetic lens according to another embodiment of the instant disclosure.
Figure 5C:
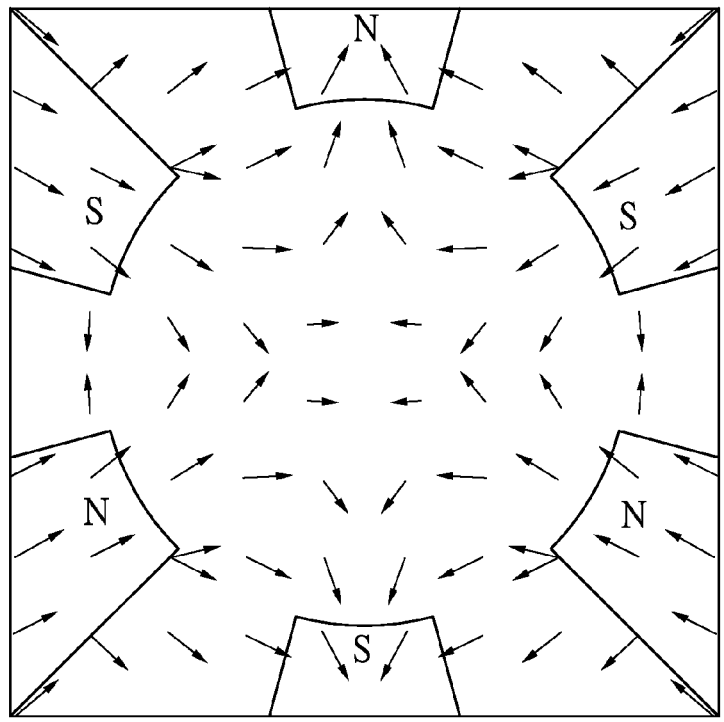
FIG. 5C shows a top view of a round hexapole magnetic lens according to another embodiment of the instant disclosure.
Figure 5D:
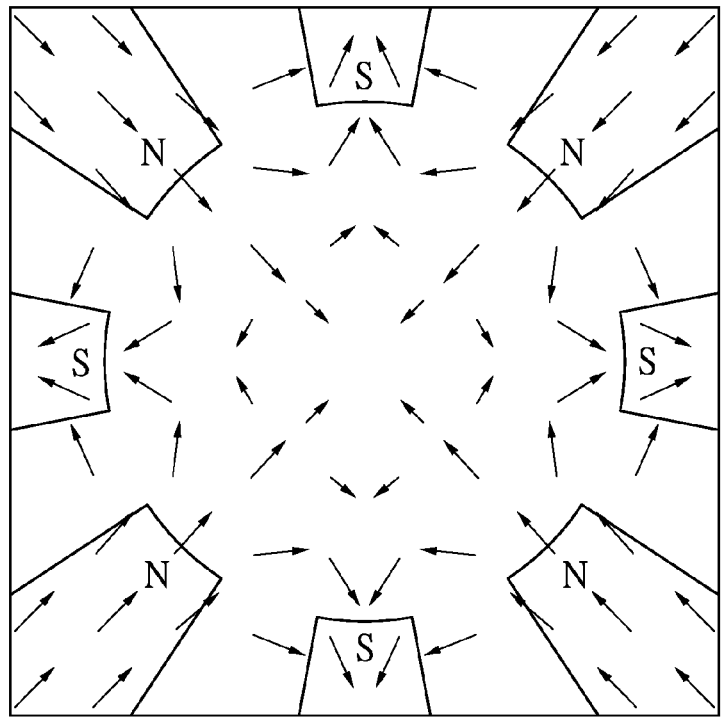
FIG. 5D shows a top view of the combined round-multipole magnetic lens shown in FIG. 4A.

Please refer to FIG. 5B, FIG. 5C and FIG. 5D, FIG. 5B shows a top view of a round quadrupole magnetic lens according to another embodiment of the instant disclosure, FIG. 5C shows a top view of a round hexapole magnetic lens according to another embodiment of the instant disclosure, FIG. 5A shows a top view of the combined round-multipole magnetic lens shown in FIG. 4A. The first pole shoe 322 and the second pole shoe 332 respectively are the pole N and the pole S (or the pole S and the pole N). The first pole shoe 322 and the adjacent second pole shoe 332 form a magnetic-circuit gap. The first pole shoe 322, the corresponding magnetic-circuit gap and the second pole shoe 332 form a first magnetic circuit.

From the above FIG. 5A, FIG. 5B, FIG. 5C and FIG. 5D, it can be summarized that when N is odd, regarding the central axis X as a center, the first pole shoe 322 and the second pole shoe 332 with different polarities are opposite each other. However, when N is even, regarding the central axis X as a center, the first pole shoe 322 and another first pole shoe 322 with the same polarity are opposite each other, and the second pole shoe 332 and another second pole shoe 332 with the same polarity are opposite each other.

According to above descriptions, a desktop electron microscope is provided, and the geometrical arrangement and design of the magnetic lens are utilized to obtain both the ability of a magnetic focusing lens and multipole lens. Also, the ratio of the functions of the magnetic focusing lens and the multipole lens can be determined by the relative size of the magnetic-circuit gap, meanwhile only one power supply is needed, such that the occupied volume could be greatly reduced. According to the embodiment of this instant disclosure, the tuning ability of the magnetic field for the magnetic lens can be effectively increased based on the same volume of the magnetic lens, which is adopted to the desktop instrument such as the focusing lens of the electron microscope, the projection lens of the transmission electron microscope, and any lens system integrated with an electron gun.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A desktop electron microscope, comprising:
   an electron gun, for providing an electron beam; and
   at least a combined round-multipole magnetic lens, comprising:
   a coil support, for winding merely one coil according to a central axis, the center of the coil support having a central opening portion for the electron beam passing through the central opening portion;
   a first pole piece, adjacently disposed at an upper-side of the coil support, having a first opening portion corresponding to the central opening portion of the coil support and a plurality of first pole shoes, the first pole shoes extending from an inner edge of the first opening portion to the central axis, wherein each of the plurality of first pole shoes has a first extending portion and a first ending portion, the first extending portion extends downward from the inner edge of the first opening portion, the first ending portion is connected with the inner edge of the first opening portion of the first pole piece through the first extending portion; and
   a second pole piece, adjacently disposed at an under-side of the coil support, having a second opening portion corresponding to the central opening portion of the coil support and a plurality of second pole shoes, the second pole shoes extending from an inner edge of the second opening portion to the central axis, each of the plurality of second pole shoes has a second extending portion and a second ending portion, the second extending portion extends upward from the inner edge of the second opening portion, the second ending portion is connected with the inner edge of the second opening portion of the second pole piece through the second extending portion, wherein the first ending portion and the second ending portion are located in the same horizontal plane, and the horizontal plane is perpendicular to the central axis;
   wherein the number of the first pole shoes and the number of the second pole shoes is N respectively, N is an integer larger than one, the plurality of first pole shoes are symmetrically arranged according to the central axis, the plurality of second pole shoes are symmetrically arranged according to the central axis, each first pole shoe and the adjacent second pole shoe differ from each other at an angle according to the central axis, and the angle is 360/2N degrees;
   wherein each first pole shoe and the adjacent second pole shoe form a magnetic-circuit gap, wherein when the coil is fed with an electric current, the first pole shoe, the corresponding magnetic-circuit gap and the second pole shoe form a first magnetic circuit.

2. The desktop electron microscope according to claim 1, wherein the combined round-multipole magnetic lens further comprises:

a permanent magnet, forming an annular structure according to the central axis, the permanent magnet disposed at the outer side of the coil away from the central axis, and located between the first pole piece and the second pole piece.

3. The desktop electron microscope according to claim 1, wherein the first opening portion of the first pole piece and the second opening portion of the second pole piece form a second magnetic circuit when the coil is fed with the electric current.

* * * * *